US009147446B2

(12) United States Patent
Nakamura

(10) Patent No.: US 9,147,446 B2
(45) Date of Patent: Sep. 29, 2015

(54) SEMICONDUCTOR DEVICE HAVING LEVEL SHIFT CIRCUIT

(71) Applicant: MICRON TECHNOLOGY, INC., Boise, ID (US)

(72) Inventor: Kohei Nakamura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/317,978

(22) Filed: Jun. 27, 2014

(65) Prior Publication Data
US 2015/0002206 A1 Jan. 1, 2015

(30) Foreign Application Priority Data

Jun. 27, 2013 (JP) .................................. 2013-134496

(51) Int. Cl.
| H03L 5/00 | (2006.01) |
| G11C 7/10 | (2006.01) |
| G11C 5/14 | (2006.01) |
| G11C 7/22 | (2006.01) |
| G11C 11/4074 | (2006.01) |
| G11C 11/4076 | (2006.01) |
| G11C 11/4093 | (2006.01) |

(52) U.S. Cl.
CPC .............. G11C 7/1039 (2013.01); G11C 5/147 (2013.01); G11C 7/106 (2013.01); G11C 7/1063 (2013.01); G11C 7/1066 (2013.01); G11C 7/1084 (2013.01); G11C 7/1087 (2013.01); G11C 7/1093 (2013.01); G11C 7/222 (2013.01); G11C 11/4074 (2013.01); G11C 11/4076 (2013.01); G11C 11/4093 (2013.01)

(58) Field of Classification Search
None
See application file for complete search history.

(56) References Cited

U.S. PATENT DOCUMENTS

| 5,600,267 A * | 2/1997 | Wong et al. ..................... 326/73 |
| 6,351,173 B1 * | 2/2002 | Ovens et al. .................. 327/333 |
| 6,407,579 B1 * | 6/2002 | Goswick ......................... 326/81 |
| 6,566,930 B1 | 5/2003 | Sato |
| 6,661,274 B1 * | 12/2003 | Naka et al. .................... 327/333 |
| 8,718,127 B2 * | 5/2014 | Acosta-Serafini et al. ... 375/232 |
| 8,860,487 B2 * | 10/2014 | Ma ................................ 327/333 |
| 2006/0114048 A1 * | 6/2006 | Shiratake et al. ............ 327/333 |
| 2009/0002052 A1 * | 1/2009 | Kiritani et al. ................ 327/333 |
| 2012/0001672 A1 * | 1/2012 | Barrow ......................... 327/333 |
| 2013/0128655 A1 * | 5/2013 | Cheng et al. ................. 365/154 |
| 2013/0321026 A1 * | 12/2013 | Rao et al. ....................... 326/80 |

* cited by examiner

Primary Examiner — Lincoln Donovan
Assistant Examiner — Khareem E Almo
(74) Attorney, Agent, or Firm — Dorsey & Whitney LLP

(57) ABSTRACT

Disclosed herein is a device includes: a level conversion circuit coupled to first and third power supply lines, receiving a first signal and an inverted signal of the first signal each having an amplitude between first and second potentials, and outputting a second signal having an amplitude between first and third potentials; a delay circuit coupled to the first and second power supply lines, and outputting a third signal delayed from the first signal; and an output circuit including first and second transistors coupled in series between the first and third power supply lines, the first transistor having a control electrode supplied with the second signal, and the second transistor having a control electrode supplied with the third signal.

14 Claims, 11 Drawing Sheets

| LEVEL SHIFT CIRCUIT 100A | TR1 | TR2 |
|---|---|---|
| In=L | 2 | 2 |
| In=H | 3 | 1 |
| DIFFERENCE | −1 | +1 |

| LEVEL SHIFT CIRCUIT 100B | TR1 | TR2 |
|---|---|---|
| In=L | 4 | 0 |
| In=H | 3 | 1 |
| DIFFERENCE | +1 | −1 |

| LEVEL SHIFT CIRCUIT 100C | TR1 | TR2 |
|---|---|---|
| In=L (PATH: X) | 2 | 2 |
| In=L (PATH: Y) | 4 | 0 |
| In=L (AVERAGE) | 3 | 1 |
| In=H | 3 | 1 |
| DIFFERENCE | 0 | 0 |

FIG.6

SEMICONDUCTOR DEVICE HAVING LEVEL SHIFT CIRCUIT

BACKGROUND

1. Field of the Invention

Embodiments of the present invention relate to a semiconductor device, and more particularly relate to a semiconductor device including a level shift circuit that converts the voltage amplitude of a signal.

2. Description of Related Art

Some semiconductor devices include a level shift circuit that converts the amplitude of a signal. There are two types of the level shift circuit, one of which is designed to decrease the signal amplitude and the other is designed to increase the signal amplitude. Among the two types, the level shift circuit designed to decrease the signal amplitude can foe configured by a simple inverter circuit. This is because the amplitude of the input-signal is larger than the amplitude of the operating voltage of the inverter circuit, and therefore at either logic level of the input signal, one of the transistors that constitute the inverter circuit can be reliably switched to the off state.

On the other hand, when the level shift circuit designed to increase the signal amplitude is configured by a simple inverter circuit, one of the transistors that constitute the inverter circuit cannot foe reliably switched to the off state depending on the logic level of the input signal. This causes a leak current. Therefore, in the level shift circuit designed to increase the signal amplitude, a circuit method as described in Japanese Patent Application Laid-open No. 2001-36388, in which two cross-coupled transistors are used, and an input signal and its inverted signal are used to turn on either one of the transistors, is mainly employed.

However, in the level shift circuit described in Japanese Patent Application Laid-open No. 2001-36388, there is sometimes a difference between the timing at which an output signal is changed in response to a change of an input signal from a first logic level to a second logic level and the timing at which an output signal is changed in response to a change of an input signal from the second logic level to the first logic level. When there is the difference between the timings as described above, it causes a difference in duty ratio between the input signal and the output signal. Therefore, a problem arises, for example, in that the effective width (window width) of read data is decreased,

SUMMARY

In one embodiment, there is provided a semiconductor device that includes: a first power supply line supplied with a first potential; a second power supply line supplied with a second potential higher than the first potential; a third power supply line supplied with a. third potential higher than the second potential; a level conversion circuit coupled to the first and third power supply lines, receiving a first signal and an inverted signal of the first signal each having an amplitude between the first and second potentials, and outputting a second signal having an amplitude between the first and third potentials; a delay circuit coupled to the first and second power supply lines, and outputting a third signal delayed from the first signal; and an output circuit including first and second transistors coupled in series between the first and third power supply lines, the first transistor having a control electrode supplied with the second signal, and the second transistor having a control electrode supplied with the third signal.

BRIEF DESCRIPTION OF THE DRAWINGS

The above features and advantages of the present invention will be more apparent from the following description of certain preferred embodiments taken in conjunction with the accompanying drawings, in which:

FIG. 6 is a table indicative of the number of transistors that are turned-on on a signal transmission path of each of the level shift circuits;

DETAILED DESCRIPTION OF THE PREFERRED EMBODIMENTS

The invention will be now described herein with reference to illustrative embodiments. Those skilled in the art will recognize that many alternative embodiments can be realized using the teachings of the present invention and that the invention is not limited to the embodiments illustrated for explanatory purposes. Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
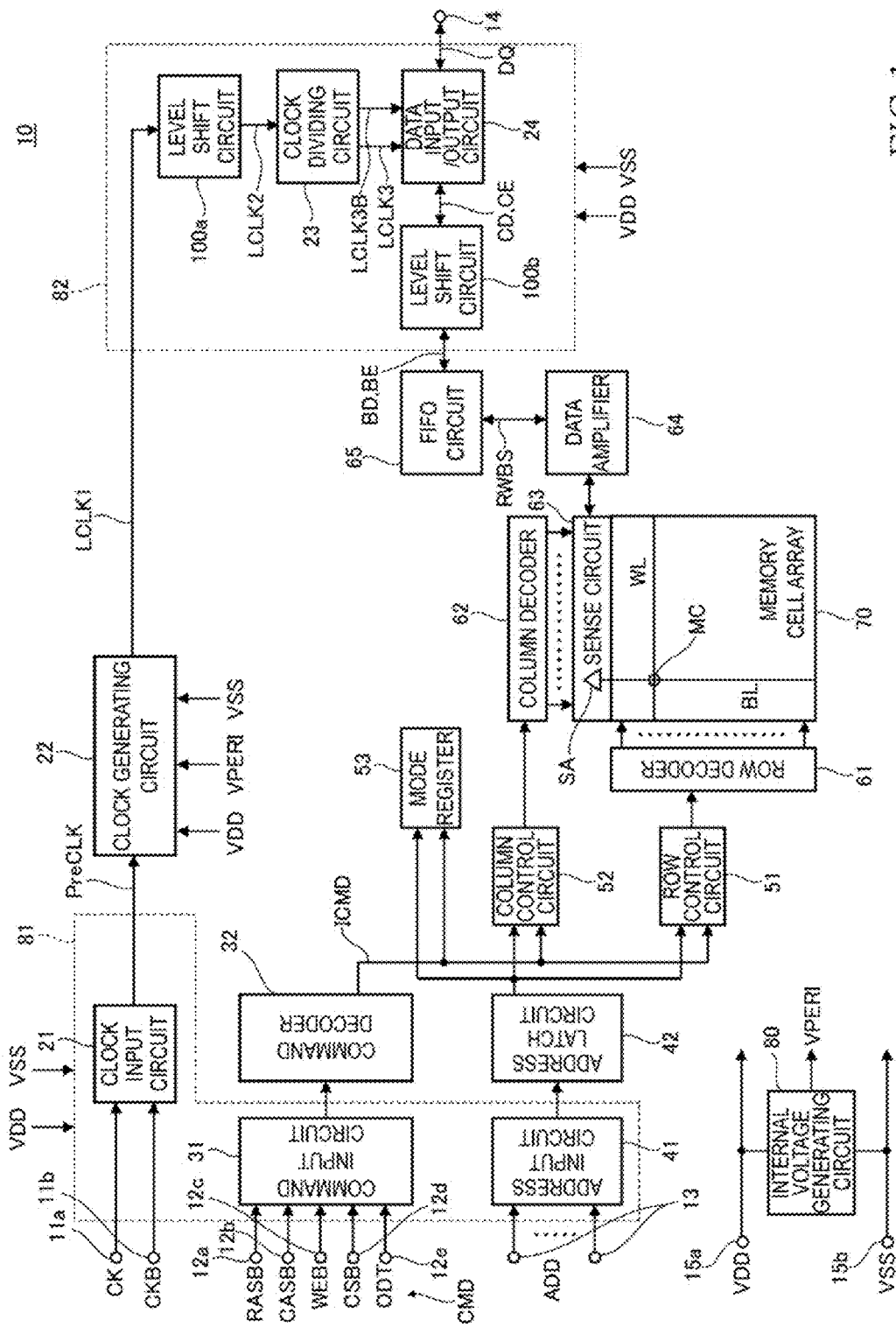
FIG. 1 is a block diagram indicative of an embodiment of a configuration of a semiconductor device according to an embodiment of the present invention.

Referring now to FIG. 1, the semiconductor device 10 according to an embodiment of the present invention is a DDR3 (Double Data Rate 3) SDRAM (Synchronous Dynamic Random Access Memory), and includes, as external terminals, clock terminals 11a and 11b, command terminals 12a to 12e, an address terminal 13, a data input/output terminal 14, and power source terminals 15a and 15b. Although not shown in FIG. 1, the semiconductor device 10 also includes a data strobe terminal, a calibration terminal and the like.

The clock terminals 11a and 11b are supplied with clock signals CK and CKB, respectively. The external clock signals CK and CKB are then transferred to a clock input circuit 21. In this specification, a signal with "B" attached at its tail means that the signal is an inverted signal of its corresponding signal or an active-low signal. Therefore, the external clock signals CK and CKB are mutually complementary signals. The clock input circuit 21 generates an internal clock signal PreCLK of a single phase based on the external clock signals CK and CKB, and supplies it to a clock generating circuit 22. The clock generating circuit 22 generates a phase-controlled internal clock signal LCLK1, and supplies it to a data input/ output circuit 24 via a level shift circuit 100a and a clock dividing circuit 23. As the clock generating circuit 22, a DLL (Delay Locked Loop) circuit can be used.

The level shift circuit 100a generates an internal clock signal LCLK2 by performing a level shift of the internal clock signal LCLK1, and the clock dividing circuit 23 is a circuit that generates internal clock signals LCLK3 and LCLK3B that are complementary signals from the internal clock signal LCLK2 of the single phase.

The command terminals 12a to 12e are supplied with a row address strobe signal RASB, a column address strobe signal CASE, a write enable signal WEB, a chip select signal CSS, and an on-die termination signal ODT, respectively. Command signals CMD including the above signals are supplied to a command input circuit 31. The command signals CMD supplied to the command input circuit 31 are then transferred to a command decoder 32. The command decoder 32 is a circuit that generates various internal commands ICMD by storing, decoding, and counting the command signals. The internal commands ICMD are then supplied to a row control circuit 51, a column control circuit 52, and a mode register 53.

The address terminal 13 is supplied with an address signal ADD. The address signal ADD is then transferred to an address input circuit 41. An output of the address input circuit 41 is supplied to an address latch circuit 42. Among the address signal ADD latched in the address latch circuit 42, a row address is supplied to the row control circuit 51, and a column address is supplied to the column control circuit 52. When a mode register set is activated, the address signal ADD is supplied to the mode register 53, thereby contents of the mode register 53 are updated.

An output of the row control circuit 51 is supplied to a row decoder 61. The row decoder 61 is a circuit that selects any one of word lines WL included in a memory cell array 70. In the memory cell array 70, a plurality of word lines and a plurality of bit lines BL interest with each other, and a memory cell MC is arranged at every intersection of the word lines WL with the bit lines BL (However, only one word line WL, one bit line BL, and one memory cell MC are shown in FIG. 1). Each of the bit lines BL is connected to its corresponding sense amplifier SA included in a sense circuit 63.

An output of the column control circuit 52 is supplied to a column-decoder 62. The column decoder 62 is a circuit that selects any one of the sense amplifiers SA included in the sense circuit. 63. The sense amplifier SA selected by the column decoder 62 is connected to a data amplifier 64. The data amplifier 64 further amplifies read data that is amplified by the sense amplifier SA at a time of a read operation, and supplies the amplified read data to a FIFO circuit 65 via a read/write bus RWBS. On the other hand, at a time of a write operation, the data amplifier 64 amplifies write data that is supplied from the FIFO circuit 65 via the read/write bus RWBS, and supplies the amplified write data to the sense amplifier SA. The FIFO circuit 6 5 is connected to the data input/output circuit 24 via a level shift circuit 100b.

The data input/output terminal 14 is a terminal for performing an. output of read data DQ and an input of write data DQ, being connected to the data input/output circuit 24. The complementary internal clock, signals LCLK3 and LCLK3B generated by the clock dividing circuit 23 are supplied to the data input/output circuit 24. At the time of the read operation, the data input/output circuit 24 burst outputs the read data DQ in synchronization with the internal clock signals LCLK3 and LCLK3B.

Although only one data input/output terminal 14 is shown in FIG. 1, the number of the data input/output terminal 14 does not have to foe one, but can be used in plural as appropriate. A specific example described later (see FIG. 2) exemplifies a case that the number of the data input/output terminal 14 is eight. As is described later, when a plurality of data input/output terminals 14 are arranged, it is necessary to provide the same number of the level shift circuits 100a and 100b, the clock dividing circuit 23, and the data input/output circuit 24.

The power source terminals 15a and 15b are supplied with an external power source potential VDD and a ground potential VSS, respectively. In this specification, a voltage between the external power source potential VDD and the ground potential VSS may be simply referred to as "external voltage VDD" as appropriate. The external voltage VDD is supplied to an internal voltage generating circuit 80 in which an internal power source potential VPERI that is a potential lower than the external power source potential VDD (VDD>VPERI>VSS) is generated. In this specification, a voltage between the internal power source potential VPERI and the ground potential VSS is simply referred to as "internal voltage VPERI" as appropriate.

The internal voltage VPERI is supplied to most of the peripheral circuits shown in FIG. 1, so that most of the peripheral circuits are operated with the internal voltage VPERI as their power sources. Therefore, amplitude of voltages of signals used in the peripheral circuits is the same as the internal voltage VPERI. On the other hand, the external voltage VDD is supplied to an input circuit group 81 and an output circuit group 82, so that the input circuit group 81 and the output circuit group 82 are operated with the external voltage VDD as their power sources. Therefore amplitude of voltages of signals used in the input circuit group 81 and the output circuit group 82 is the same as the external voltage VDD. In this manner, as most of the peripheral circuits except, for the input circuit group 81 and the output circuit group 82 are operated with the internal voltage VPERI having a lower voltage, it is possible to reduce the power consumption. In the memory ceil array 70, an array voltage (VARY), a high voltage (VPP) exceeding the external voltage VDD, and a negative voltage (VBB) are also used. However, because it is not directly relevant to the scope of the present invention on this regard, explanations thereof will be omitted.

The input circuit group 81 is a circuit group including the input circuits 21, 31, and 41. Therefore, amplitude of voltages of output signals from the input circuits 21, 31, and 41 is the same as the external voltage VDD. However, because a circuit at the next stage is operated with the internal voltage VPERI, amplitude of voltages of signals at the following stages becomes the internal voltage VPERI.

The output circuit group 82 is a circuit group including the level shift circuits 100a and 100b, the clock dividing circuit 23, and the data input/output circuit 24. The level shift circuits 100a and 100b are circuits that convert a signal having the amplitude of the internal voltage VPERI into a signal having the amplitude of the external voltage VDD. That is, the level shift circuits 100a and 100b are circuits that increase amplitude of a voltage. Therefore, amplitude of voltages of signals used in the clock dividing circuit 23 and the data input/output circuit 24 becomes the external voltage VDD. Hereinafter., the level shift circuits 100a and 100b may be collectively called as the level shift circuit 100 (100A to 100D).

Figure 2:
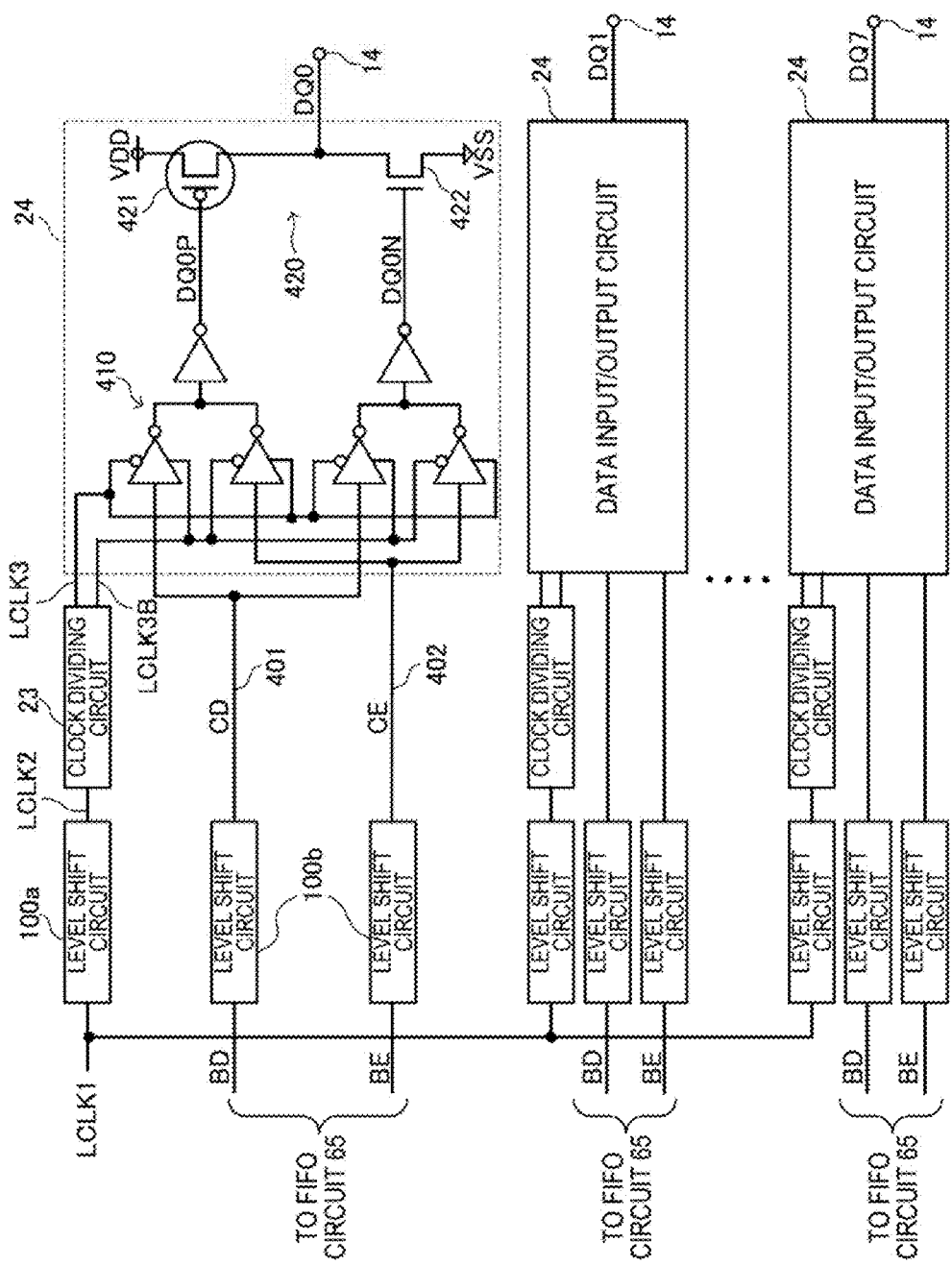
FIG. 2 is a circuit diagram indicative of an embodiment of the data input/output circuit and associated circuits.

Turning to FIG. 2, the data input/output circuit 24 includes a multiplexer 410 that receives the internal data signals CD and CE through data lines 401 and 402, respectively, and an output buffer 420 that receives internal signals DQ0P and DQ0N that are outputs of the multiplexer 410 and outputs read data DQ0 from the data input/output terminal 14 based on the internal signals DQ0P and DQ0N.

The multiplexer 410 outputs the internal data signal CD supplied through the data line 401 in synchronization with a rising edge of the internal clock signal LCLK3, and at the* same time, outputs the internal data signal CE supplied through the data line 402 in synchronization with a rising edge of the internal clock signal LCLK3B, The internal signals DQ0P and DQ0N that are the outputs of the multiplexer 410 are respectively supplied to gate electrodes of a P-channel MOS transistor 421 and an N-channel MOS transistor 422 that constitute the output buffer 420. With this configuration, at the rising edge of the internal clock signal LCLK3, either one of the transistors 421 and 422 is turned on based on a logical level of the internal data signal CD, and a read data DQ of a high level or a low level is output. Similarly, at the rising edge of the internal clock signal LCLK3B, either one of the transistors 421 and 422 is turned on based on a logical level of the internal data signal CE, and the read data DQ of a high level or a low level is output. With this operation, the read data DQ0 is continuously output from the data input/output terminal 14.

Both of the internal data signals CD and CE supplied respectively through the data lines 401 and 402 are signals that went through the level shift circuit 100b. That is, amplitude of voltages of the internal data signals CD and CE is the same as the external voltage VDD. Therefore, it is not necessary to provide a level shift circuit in the data input/output circuit 24. Furthermore, because the internal clock signals LCLK3 and LCLK3B supplied from the clock dividing circuit 23 are precisely complementary signals already level-shifted, there occurs no skew in the read data DQ0 that are continuously output based on the internal clock signals LCLK3 and LCLK3B.

In FIG. 2, a case that eight data input/output terminals 14 are arranged is shown as an example. That is, in the present example, 8 bits of read data DQ0 to DQ7 are output in parallel. As shown in FIG. 2, when the eight data input/output terminals 14 are arranged, eight sets of the level shift circuits 100a and 100b, the clock dividing circuit 23, and the data input/output circuit 24 are arranged accordingly.

Next, a specific circuit configuration of the level shift circuit 100 (100a and 100b) is explained.

Figure 3:
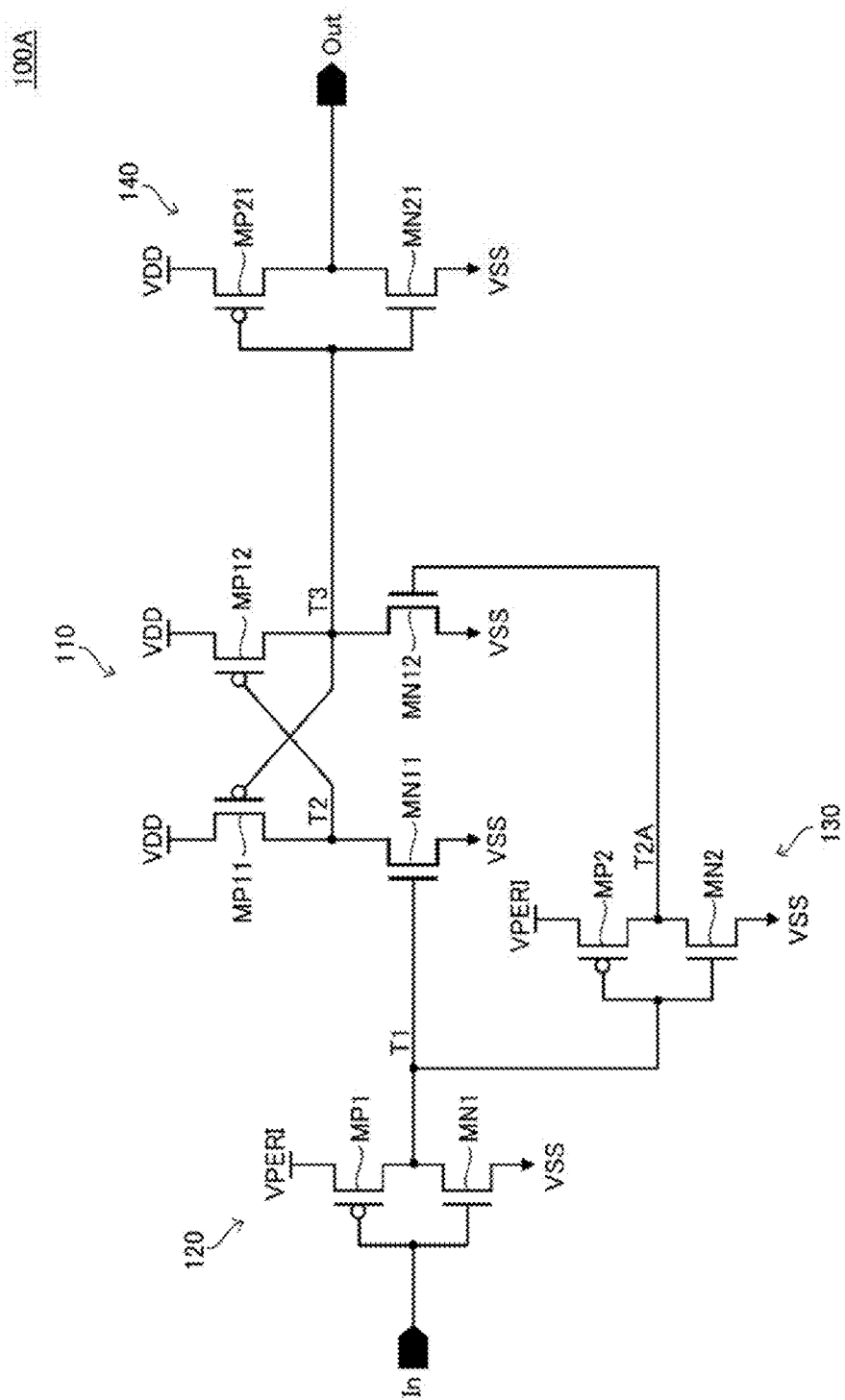
FIG. 3 is a circuit diagram indicative of an embodiment of a prototype level shift circuit that was considered by the present inventor in the process of arriving at the present invention.

Turning to FIG. 3, the prototype level shift circuit 100A includes a level conversion unit 110 and three inverter circuits 120, 130, and 140. The level conversion unit 110 includes cross-coupled P-channel MOS transistors MP11 and MP12, and N-channel MOS transistors MN11 and MN12 that are respectively connected in series to the transistors MP11 and MP12. More specifically, each source of the transistors MP11 arid MP12 is connected to a power supply line to which the external power-supply potential VDD is supplied, and drains of the transistors MP11 and MP12 are connected to nodes T2 and T3, respectively. A gate electrode of the transistor MP11 is connected to the node T3. A gate electrode of the transistor MP12 is connected to the node T2. Each source of the transistors MN11 and MN12 is connected to a power supply line to which the ground potential VSS is supplied, and drains of the transistors MN11 and MN12 are connected to the nodes T2 and T3, respectively, Gate electrodes of the transistors MN11 and MN12 are connected to nodes T1 and T2A, respectively. The node T1 is an output node of the inverter circuit 120. The node T2A is an output node of the inverter circuit 130. As shown in FIG. 3, the inverter circuits 120 and 130 are connected in series, and an input signal In (LCLK1, BD, and BE) is input to an input node of the inverter circuit 120. Therefore, an inverted signal of the input signal In appears at the node T1, and a delayed signal of the input signal In appears at the node T2A.

The operating voltage of both the inverter circuits 120 and 130 is the internal voltage VPERI. More specifically, the inverter circuit 120 is constituted by a P-channel MOS transistor MP1 and an N-channel MOS transistor MN1 that are connected in series between a power supply line, to which the internal power-supply potential VPERI is supplied, and a power supply line, to which the ground potential VSS is supplied. The input signal In is supplied to gate electrodes of the transistors MP1 and MN1. Similarly, the inverter circuit 130 is constituted by a P-channel MOS transistor MP2 and an N-channel MOS transistor MN2 that are connected in series between a power supply line, to which the internal power-supply potential VPERI is supplied, and a power supply line, to which the ground potential VSS is supplied. Gate electrodes of the transistors MP2 and MN2 are connected to the node T1.

Meanwhile, the operating voltage of the inverter circuit 140 is the external voltage VDD. The inverter circuit 140 is constituted by a P-channel MOS transistor MP21 and an N-channel MOS transistor MN21 that are connected in series between a power supply line, to which the external power-supply potential VDD is supplied, and a power supply line, to which the ground potential VSS is supplied. Gate electrodes of the transistors MP21 and MN21 are connected to the node T3.

With this configuration, the input signal In with the amplitude of the internal voltage VPERI is level-converted into an output signal Out. with the amplitude of the external voltage VDD.

However, the prototype level shift circuit 100A shown in FIG. 3 has a problem in that a difference in duty ratio between the input signal In and the output signal Out tends to be generated. This point is explained below.

First, an operation of the level shift circuit 100A in a case when the input signal In is changed from a low level to a high level is explained. In a low level state before the input signal In is changed to a high level, the node T1 is at a high level, and the node T2A is at a low level, and therefore the transistors MP12 and MN11 are in the on state, and the transistors MP11 and MN12 are in the off state.

When the input signal In is changed from a low level to a high level, the level of each of the nodes T1 and T2A is inverted in response to this change, The level of the node T1 is inverted with a slight delay after the input signal In is inverted. The level of the node T2A is inverted with a slight delay after the level of the node T1 is inverted. However, these delay amounts are very small because the nodes T1 and T2A are driven respectively by the inverter circuits 120 and 130 that have a normal circuit configuration.

When the node T1 is changed to a low level, the transistor MN11 is turned off. However, at this time, the transistor MP11 is also off, and therefore the level of the node T2 is not changed at this point in time. On the other hand, when the node T2A is changed to a high level, the transistor MN12 is turned on. However, at this time, the transistor MP12 is also on, and therefore the level of the node T3 is not changed rapidly, but is changed at a predetermined slew rate determined by the drive capability ratio between the transistor MP12 and the transistor MN12.

When the level of the node T3 exceeds a threshold voltage of the inverter circuit 140, the output signal Out is changed from a low level to a high level. Because the transistor MP11 is turned on, the node T2 is changed to a high level.

Next, an operation of the level shift circuit 100A in a case when the input signal In is changed from a high level to a low level. In the high level state before the input signal In is changed to a low level, the node T1 is at a low level, and the node T2A is at a high level. Therefore, the transistors MP11 and MN12 are in the on state, and the transistors MP12 and MN11 are in the off state.

The input signal In is changed from a high level to a low level, and in response to this change, the node T2A is changed to a low level, and the transistor MN12 is turned off. However, because at this time, the transistor MP12 is also off, the level of the node T3 is not changed at this point in time. On the other hand, when the node T1 is changed to a high level, the transistor MN11 is turned on. However, at this time, the transistor MP11 is also on, and therefore the level of the node T2 is not changed rapidly, but is changed at a predetermined slew rate determined by the drive capability ratio between the transistor MP11 and the transistor MN11.

When the level of the node T2 exceeds a threshold voltage of the transistor MP12, the transistor MP12 is turned on, and the level of the node T3 is increased. Therefore, the output signal Out is changed from a high level to a low level.

As explained above, when the input signal In rises, the transistor MP21 can be turned on relatively earlier by turning on the transistor MN12. On the other hand, when the input signal In falls, it is necessary to turn on the transistor MP12 through the transistor MN11 in order to turn on the transistor MN21.

This indicates that the timing difference between when the input signal In falls and when the output signal Out falls can be larger than the timing difference between when the input signal In rises and when the output signal Out rises. In this case, the duty ratio of the output signal Out becomes higher than the duty ratio of the input signal In. Therefore, even when the duty ratio of the input signal In is 50%, the duty ratio of the output signal Out becomes higher than 50%. When the deviation of the duty ratio as described above is caused in an internal clock signal LCLK2 or an internal data signal, a problem arises in that the data effective width (window width) is decreased.

The problem as described above can be solved by optimizing each current drive capability of the transistors MP11, MP12, MN11, and MN12 that constitute the level conversion unit 110, However, the external power-supply potential VDD and the internal voltage VPERI are not always determined at a uniform level at the time of designing. In many cases, different levels of the external power-supply potential VDD and the internal voltage VPERI are used in practice depending on the specifications. In such a case, although the current drive capability is optimized based on a predetermined level, a level different from the predetermined level is used in practice, which causes a large deviation of the duty ratio.

Level shift circuits according to several embodiments explained below make it possible to solve the problems of the prototype level shift circuit 100A described above, and to reduce the deviation of the duty ratio.

Figure 4:
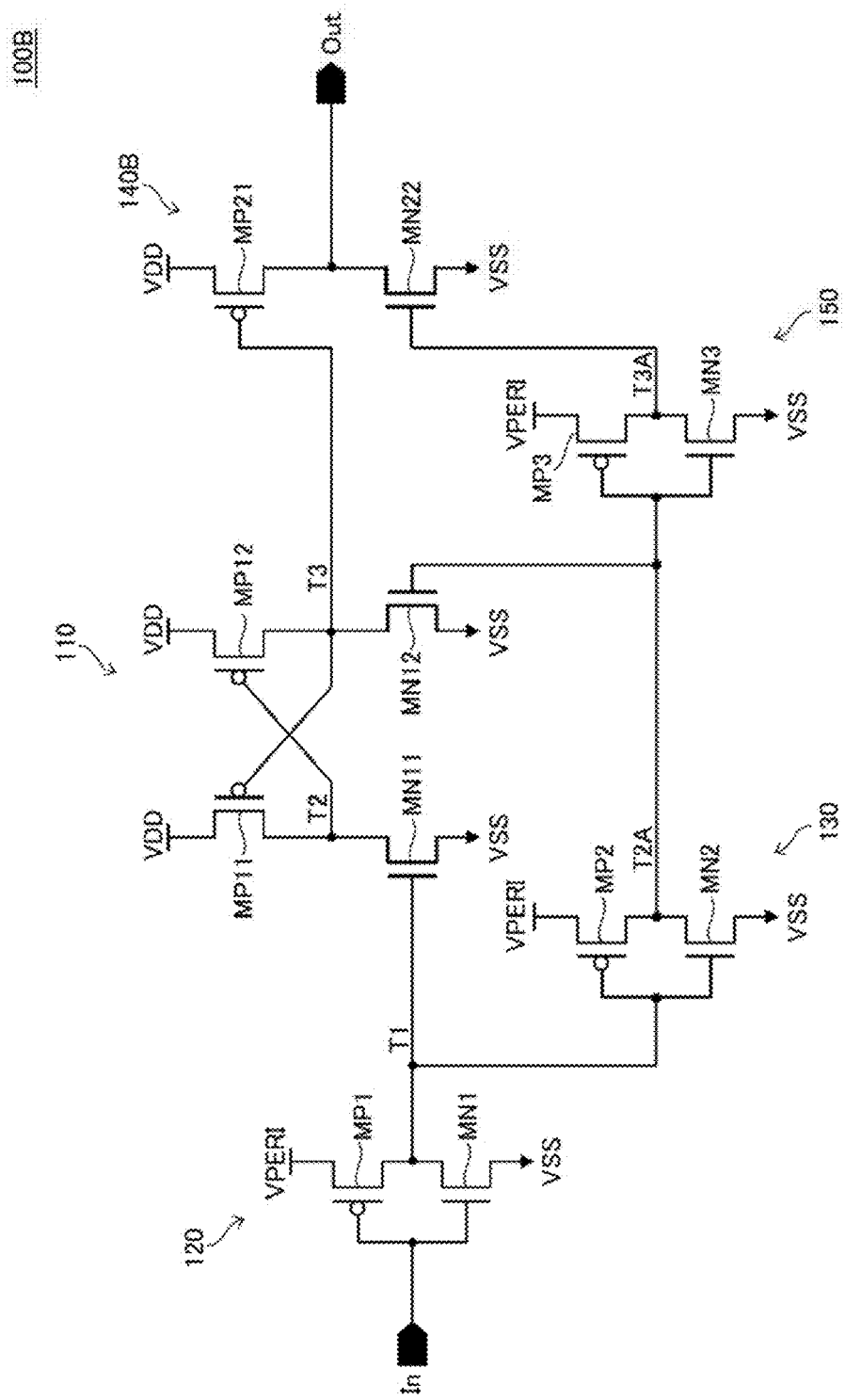
FIG. 4 is a circuit diagram indicative of an embodiment of a level shift circuit 100B according to a first embodiment of the present invention.

Turning to FIG. 4, the level shift circuit 100B according to the first embodiment is different from the level shift circuit 100A shown in FIG. 3 in that the inverter circuit 140 is replaced with an output circuit 140B, and an inverter circuit 150 is added. Other features of the level shift circuit 100B are basically identical to those of the level shift circuit 100A shown in FIG. 3, and thus like reference numerals are denoted to like elements and redundant explanations thereof will be omitted.

The inverter circuit 150 is constituted by a P-channel MOS transistor MP3 and an N-channel MOS transistor MN3 that are connected in series between a power supply line, to which the internal power-supply potential VPERI is supplied, and a power supply line, to which the ground potential VSS is supplied. An input node of the inverter circuit 150 is connected to the node T2A. An output node of the inverter circuit 150 is connected to a node T3A.

The output circuit 140B is constituted by the P-channel MOS transistor MP21 and an N-channel MOS transistor MN22 that are connected in series between a power supply line, to which the external power-supply potential VDD is supplied, and a power supply line, to which the ground potential VSS is supplied. A gate electrode of the transistor MP21 is connected to the node T3. A gate electrode of the transistor MN22 is connected to the node T3A.

As shown in FIG. 4, because the inverter circuits 130 and 150 are connected in series, a signal delayed from the inverted signal of the input signal In appears at the node T3A. That is, the inverter circuits 130 and 150 constitute a delay circuit.

Although not particularly limited thereto, it is preferable to use transistors with a lower threshold voltage as the transistors MN11, MN12, and MN22, compared to the threshold voltage of the other transistors that constitute the level shift circuit 100B. The reason for this is to improve the responsiveness and current drive capability of each of the transistors MN11, MN12, and MN22 in order to reduce the deviation of the duty ratio. It is preferable to set the W/L (channel width/channel length) of the transistors MN11, MN12, MP11, and MP12 such that the current drive capability of the transistors MN11 and MN12 becomes sufficiently higher than the current drive capability of the transistors MP11 and MP12. Specifically, the W/L of the transistors MP11 and MP12 can be 1.2 µm/0.10 µm, and the W/L of the transistors MN11 and MN12 can be 3.2 µm/0.14 µm.

Similarly, it is preferable to set the W/L of the transistors MN22 and MP21 such that the current drive capability of the transistor MN22 becomes higher than the current drive capability of the transistor MP21 to a certain degree. Specifically, the W/L of the transistor MP21 can be 2.4 µm/0.10 µm, and the W/L of the transistor MN22 can be 2.4 µm/0.14 µm. It suffices that the W/L of the other P-channel MOS transistors MP1 to MP3 is 5.2 µm/0.06 µm, and the W/L of the other N-channel MOS transistors MN1 to MN3 is 2.4 µm/0.06 µm.

Next, an operation of the level shift circuit 100B shown in FIG. 4 is explained.

An operation of the level shift circuit 100B in a case when the input signal In is changed from a low level to a high level is basically the same as the operation of the level shift circuit 100A, shown in FIG. 3. That is, when the node T1 is changed to a low level in response to the change of the input signal In, the transistor MN11 is turned off. However, at this time, the transistor MP11 is also off, and therefore the level of the node T2 is not changed. On the other hand, when the node T2A is changed to a high level, the transistor MN12 is turned on. However, at this time, the transistor MP12 is also on, and therefore the level of the node T3 is not changed rapidly, but is changed at a predetermined slew rate determined by the drive capability ratio between the transistor MP12 and the transistor MN12.

When the level of the node T3 exceeds a threshold voltage of the output circuit 140B, the output signal Out is changed from a low level to a nigh level. Because the transistor MP11 is turned on, the node T2 is changed to a high level. As described above, the operation of the level shift circuit 100B in a case when the input signal In is changed from a low level to a high level is basically the same as the operation of the level shift circuit 100A shown in FIG. 3.

On the other hand, an operation of the level shift circuit 100B in a case when the input signal In is changed from a high level to a low level is very different from the operation of the level shift circuit 100A shown in FIG. 3. An operation of the level conversion unit 110 is the same as that in the level shift circuit 100A. However, because in the level shift circuit 100B according to the first embodiment, an output signal of the level conversion unit 110 is not supplied to the transistor MN22, the above operation is not related to the timing at which the output signal Out falls.

In the first embodiment, when the input signal In is changed from a high level to a low level, the node T3A is changed from a low level to a high level after a lapse of a predetermined delay time. Because in response to this, the transistor MN22 is turned on, the output signal Out is immediately changed from a high level to a low level. Thereafter, when the level of the node T2 exceeds a threshold voltage of the transistor MP12, the transistor MP12 is turned on, and the level of the node T3 is increased. Therefore, the transistor MP21 is turned off.

Through the operation as described above, in the level shift circuit 100B according to the first embodiment, a timing difference between when the input signal In falls and when the output signal Out fails is reduced as compared to the level shift circuit 100A shown in FIG. 3. This solves the problem of the level shift circuit 100A with a delay in the fall of the output signal Out, and therefore makes it possible to reduce the deviation of the duty ratio of the output signal Out. Further, because it is possible to set the current drive capabilities of the transistors MP21 and MN22 independently of each other, the degree of design flexibility is also increased.

A second embodiment of the present invention is explained next.

Figure 5:
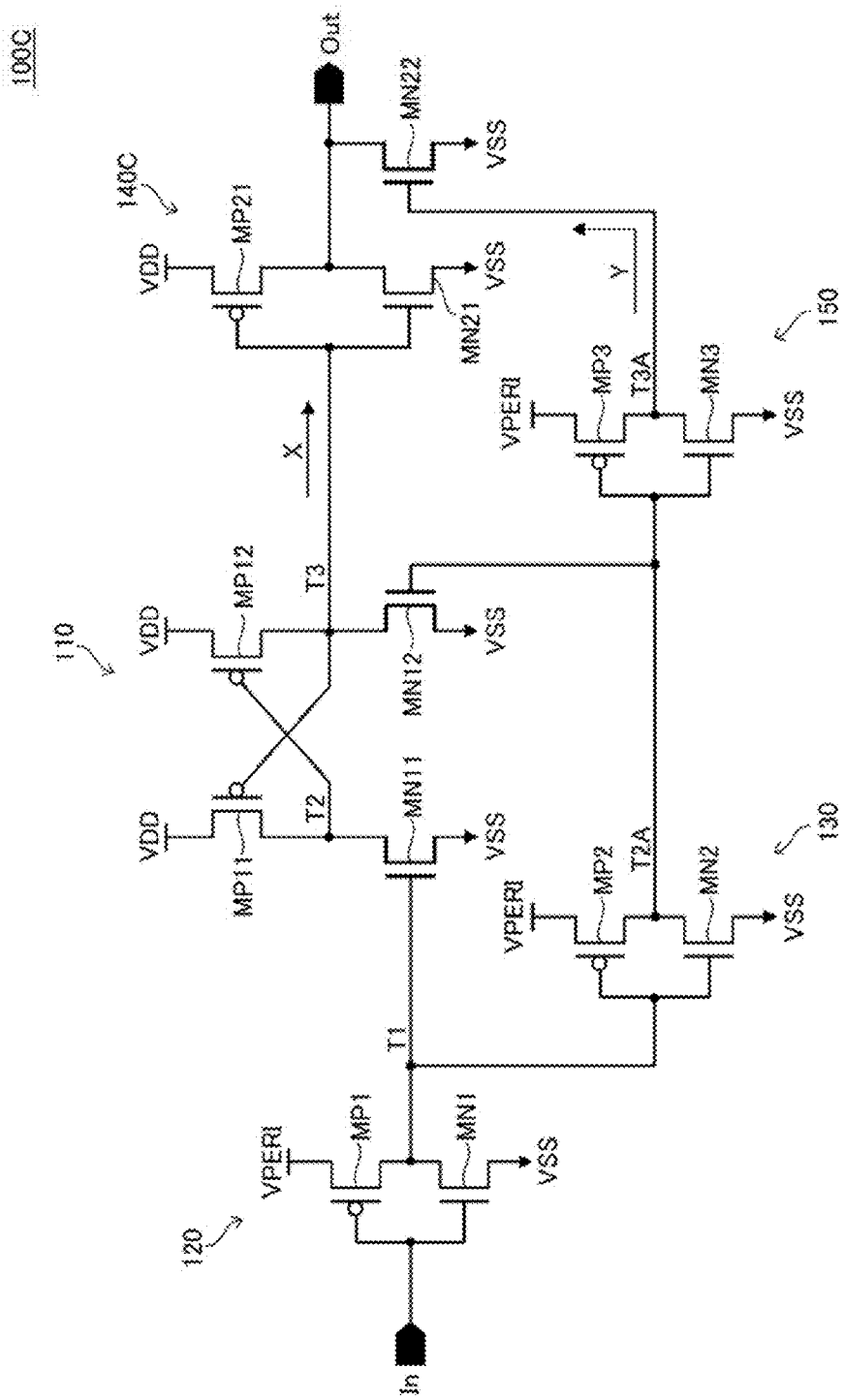
FIG. 5 is a circuit diagram indicative of an embodiment of a level shift circuit according to the second embodiment.

Turning to FIG. 5, the level shift circuit 100C according to the second embodiment is different from the level shift circuit 100B shown in FIG. 4 in that the output circuit 140B is replaced with an output circuit 140C. Other features of the level shift circuit. 100C are basically identical to those of the level shift circuit 100B shown in FIG. 4, and thus like reference numerals are denoted to like elements and redundant explanations thereof will be omitted.

The output circuit 140C has a configuration in which the transistor MN22 is connected in parallel to the transistor MN21 included in the inverter circuit 14 0 shown in FIG. 3. That is, the output circuit 140C has a circuit configuration in which the inverter circuit 140 shown in FIG. 3 and the output circuit 140B shown in FIG. 4 are combined. However, it is preferable to set the current drive capabilities of the transistors MN21 and MN22 to be smaller than the current drive capability of the transistor MN21 shown in FIG. 3 and the current drive capability of the transistor MN22 shown in FIG, 4, respectively, such that the capability to cause the output signal Out to fall does not become excessive. Specifically, when the values of the W/L of the other transistors are as described above, it is preferable that the W/L of the transistor MN21 is 0.8 μm/0.14 μm, and the W/L of the transistor; MN22 is 1.2 μm/0.14 μm. In this case, the current drive capability of the transistor MN21 is approximately half the current drive capability of the transistor MN21 shown in FIG. 3, and the current drive capability of the transistor MN22 is approximately half the current drive capability of the transistor MN22 shown in FIG. 4.

Turning to FIG. 6, for each logic level of the input signal In, the number of transistors TR1 that receive a signal with the amplitude of the internal voltage VPERI at the gate electrode, and the number of transistors TR2 that receive a signal with the amplitude of the external voltage VDD at the gate electrode are shown.

First, in the case of the level shift circuit 100A, when the input signal In is at a low level, the transistors MP1, MN11, MP12, and MN21 are turned on. Therefore, the number of the transistors TR1 is two, and the number of the transistors TR2 is two. On the other hand, when the input signal In is at a high level, the transistors MN1, MP2, MN12, and MP21 are turned on. Therefore, the number of the transistors TR1 is three, and the number of the transistors TR2 is one. As described above, in the level shift circuit 100A, conditions of the signal transmission path are different between when the input signal In is at a low level and when the input signal In is at a high level. Therefore, when the actual levels of the external voltage VDD and the internal voltage VPERI deviate from their respective set values, a deviation of the duty ratio is more likely to occur accordingly.

Similarly, in the case of the level shift circuit 100B, when the input signal In is at a low level, the transistors MP1, MN2, MP3, and MN22 are turned on. Therefore, the number of the transistors TR1 is four, and the number of the transistors TR2 is zero. Although the transistors MN11 and MP12 are turned on, this does not contribute to the fall of the output signal Out, and therefore the transistors MN11 and MP12 are not counted. On the other hand, when the input signal In is at a high level, the transistors MN1, MP2, MN12, and MP21 are turned on. Therefore, the number of the transistors TR1 is three, and the number of the transistors TR2 is one. As described above, also in the level shift circuit 100B, conditions of the signal transmission path are different between when the input signal In is at a low level and when the input signal In is at a high level.

On the other hand, in the case of the level shift circuit 100C, when the input signal In is at a low level, a path X and a path Y shown in FIG. 5 both contribute to the fall of the output signal Out. The transistors MP1, MN11, MP12, and MN21 are turned-on on the path X, and the transistors MP1, MN2, MP3, and MN22 are turned-on on the path Y. The transistors MP1, MN11, MP12, and MN21 and the transistors MP1, MN2, MP3, and MN22 can be considered to contribute 50% each to the fall of the output signal Out. Therefore, the average number of the transistors TR1 is three, and the average number of the transistors TR2 is one. This average numbers of the transistors TR1 and this average number of the transistors TR2 respectively correspond with the number of the transistors TR1 and the number of the transistors TR2 when the input signal In is at a high level. Accordingly, conditions of the signal transmission path when the input signal In is at a low level are almost the same as those when the input signal In is at a high level. This makes it possible to reduce the deviation of the duty ratio over a wide range of the external voltage VDD and the internal voltage VPERI.

A third embodiment of the present invention is explained next.

Figure 7:
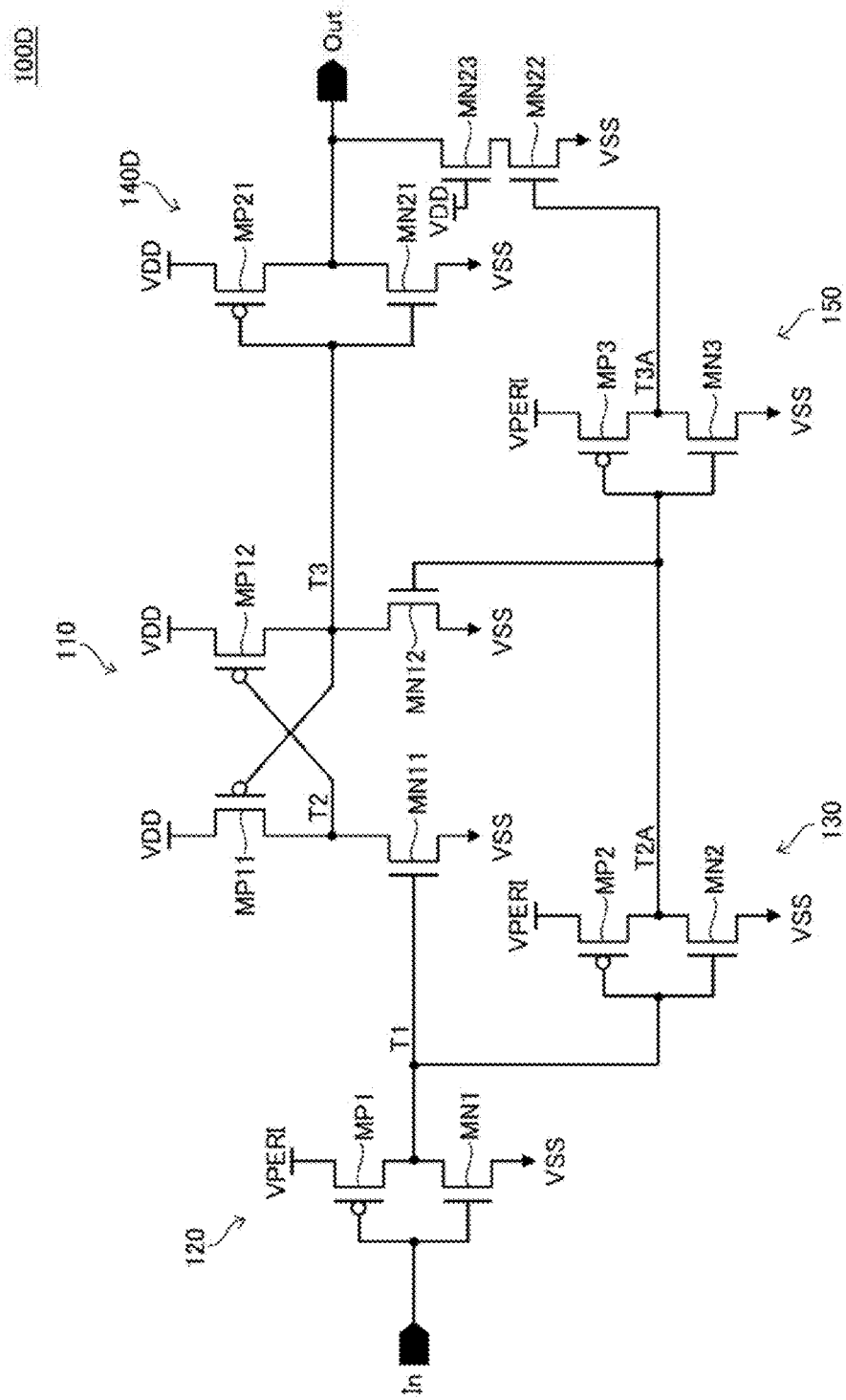
FIG. 7 is a circuit diagram indicative of an embodiment of a level shift circuit according to the third embodiment.

Turning to FIG. 7, the level shift circuit 100D according to the third embodiment is different from the level shift circuit. 100C shown in FIG. 5 in that the output circuit 140C is replaced with an output circuit 140D. Other features of the level shift circuit 100D are basically identical to those of the level shift circuit 100C shown in FIG. 5, and thus like reference numerals are denoted to like elements and redundant explanations thereof will be omitted.

The output circuit 140D is different from the output circuit. 140C in that an N-channel MOS transistor MM23 that is connected in series to the transistor MN22 is added. The external power-supply potential VDD is supplied to a gate electrode of the transistor MN23 in a fixed manner. Therefore, the transistor MN23 is normally in the on state, however, its on-resistance is changed according to the level of the external power-supply potential VDD. Specifically, as the level of the external power-supply potential VDD becomes higher, the on-resistance becomes lower, and as the level of the external power-supply potential VDD becomes lower, the on-resistance becomes higher.

With this configuration, the fall characteristics of the output signal Out in response to the fall of the input signal In are changed according to the external voltage VDD. In the level shift circuit 100A shown in FIG. 3, there is a tendency of a delay in the fall of the output signal Out in response to the fail of the input signal In, as compared to the rise of the output signal Out in response to the rise of the input signal In. Therefore, in order to correct this delay, the fall responsiveness of the output signal Out is improved in the level shift circuits 100B and 100C. A delay in the fall of the output signal Out is more significant as the external voltage VDD becomes higher than the internal voltage VPERI. Therefore, the configuration of the level shift circuits 100B and 100C is very effective in a case in which the external voltage VDD is sufficiently higher than the internal voltage VPSRI. However, when there is a small difference between the internal voltage VPERI and the external voltage VDD (or when VPERI>VDD), there is a possibility of excessively improving the fall responsiveness by the level shift circuits 100B and 100C.

In consideration of the points described above, the transistor MN23 is added in the level shift circuit 100D according to the third embodiment. In the transistor MN23, the on-resistance becomes higher as the level of the external power-supply potential VDD becomes lower. Therefore, in the third embodiment, the amount of improvement in the fall responsiveness of the output signal Out becomes smaller as the level of the external power-supply potential VDD becomes lower. Accordingly, the fall responsiveness of the output signal Out is not excessively improved, and it is possible to more effectively reduce the deviation of the duty ratio over a wide range of the external voltage VDD and the internal voltage VPERI.

Turning to FIGS. 8A to 8D, the duty ratio of the output signal Out of each of the level shift circuits 100A to 100D with respect to voltage when the duty ratio of the input signal In is 50% is shown. Simulation conditions are that the frequency of the input signal In is 1 GHz, the internal voltage VPERI ranges from 0.8 to 1.2 V, and the external voltage VDD ranges from 1.0 to 3.0 V.

Figure 8A:
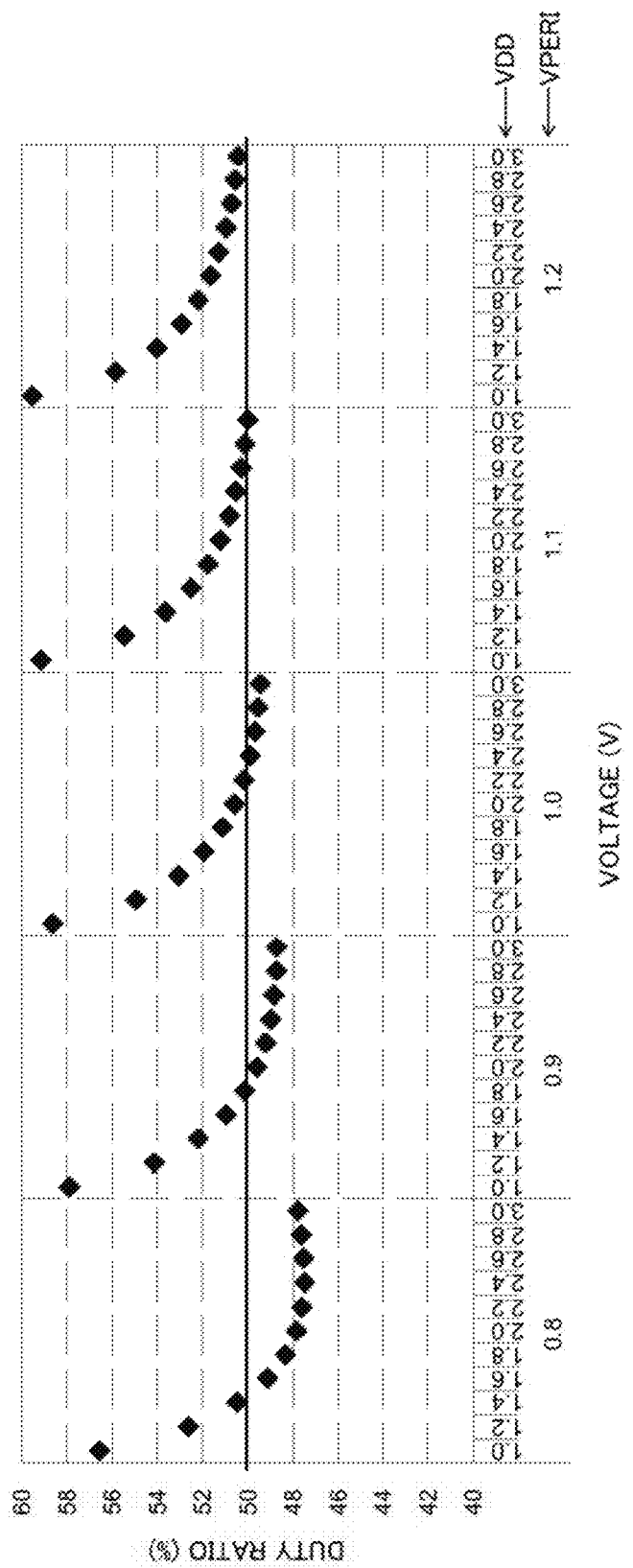
FIGS. 8A to 8D are graphs indicative of embodiments of voltage dependence of the level shift circuits.
Figure 8B:
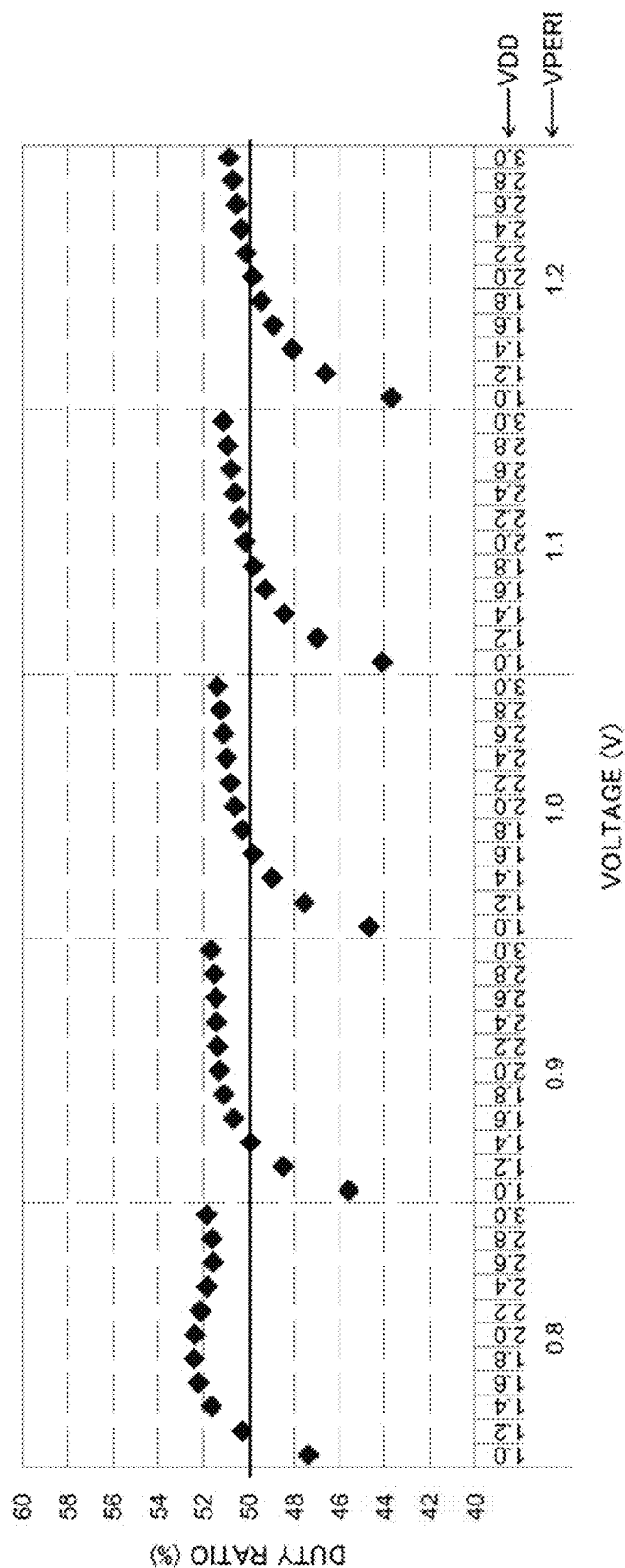
Figure 8C:
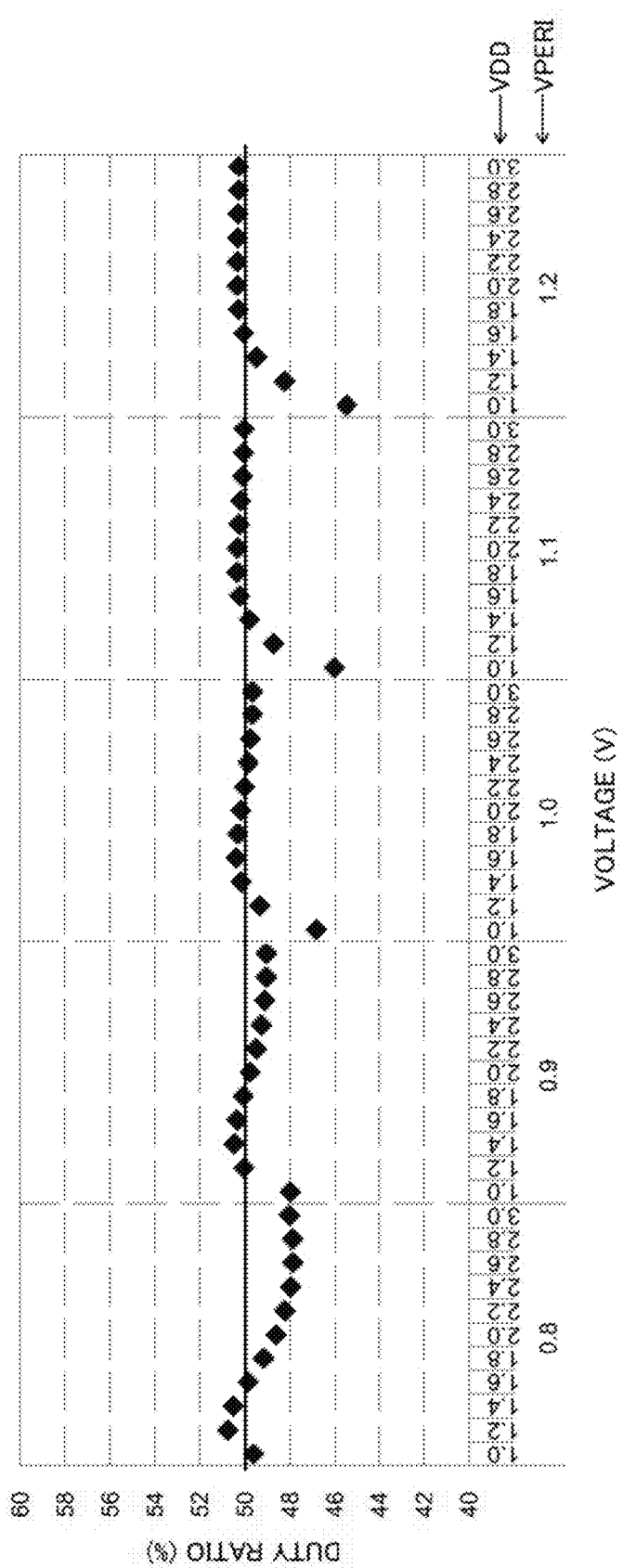
Figure 8D:
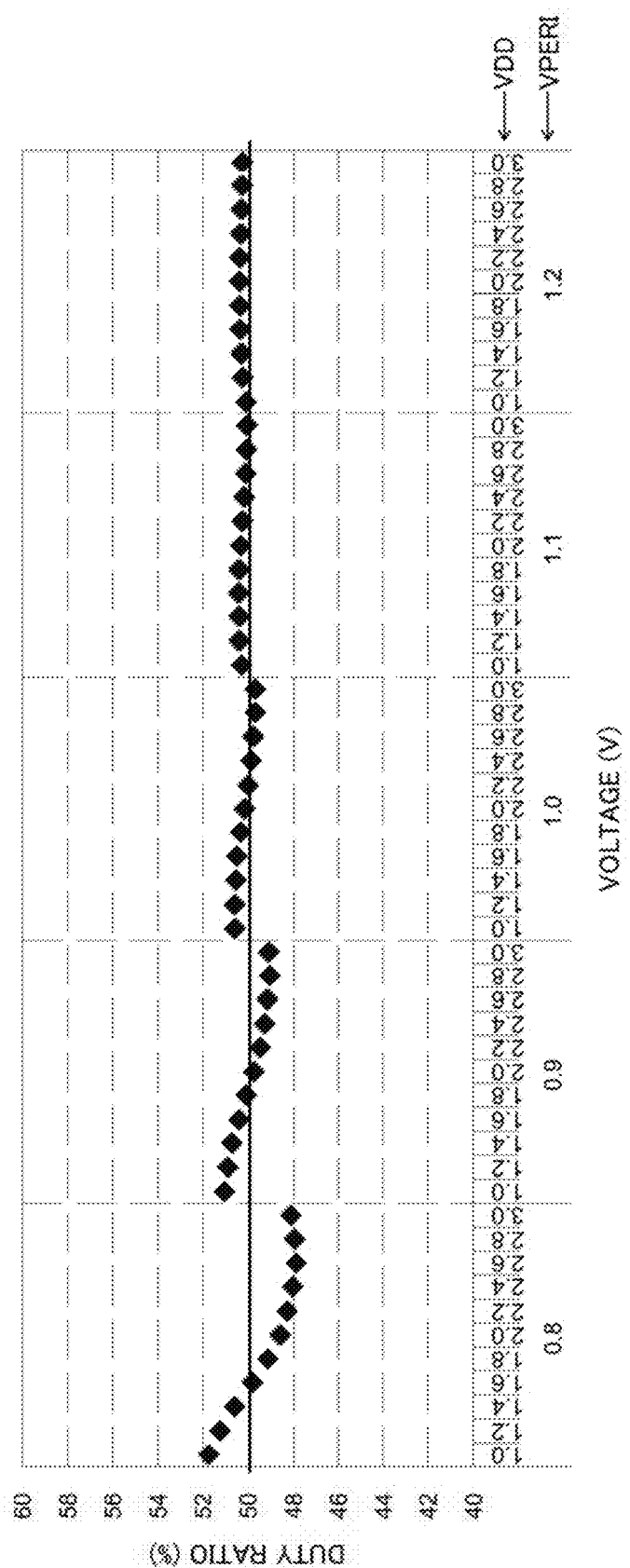

As shown in FIG. 8A, the level shift circuit 100A has large voltage dependence, and the voltage range within which the duty ratio of the output signal Out is approximately 50% is narrow. On the other; hand, as shown in FIGS. 8B to 8D, the level shift circuits 100B to 100D have smaller voltage dependence. It is under-stood that the voltage range within which the duty ratio of the output signal Out is approximately 50% becomes wider. Particularly, it. is possible for the level shift circuit 100D to achieve an approximately 50% duty ratio of the output signal Out over the very wide voltage range.

According to the embodiments of the present invention, it is possible to reduce a difference between the timing at which an output signal is changed in response to a change of an input signal from a first logic level to a second logic level and the timing at which an output signal is changed in response to a change of an input signal from the second logic level to the first logic level.

It is apparent that the present invention is not limited to the above embodiments, but may be modified and changed without departing from the scope and spirit of the invention.

For example, in the embodiments described above, there has been explained a case, as an example, in which the input signal In with the amplitude of the internal voltage VPERI is level-converted into the output signal Out with the amplitude of the external voltage VDD. However, the present invention is not limited thereto. For another example, the present invention is applicable to a case in which the input signal In with the amplitude of an external voltage VDD1 is level-converted into the output signal Out with the amplitude of an external voltage VDD2 (>VDD1). For still another example, the present invention is also applicable to a case in which the input signal In with the amplitude of an internal voltage VINT1 is level-converted into the output signal Out with the amplitude of an internal voltage VINT2 (>VINT1).

What is claimed is:
1. A semiconductor device comprising:
   a memory cell array including a plurality of memory cells,
   a first power supply line supplied with a first potential;
   a second power supply line supplied with a second potential higher than the first potential;
   a third power supply line supplied with a third potential higher than the second potential;
   a level conversion circuit coupled to the first and third power supply lines, receiving a first signal and an inverted signal of the first signal each having an amplitude between the first and second potentials, and outputting a second signal having an amplitude between the first and third potentials, wherein the first signal is an internal data signal read from the memory cell array;
   a delay circuit, coupled to the first and second power supply lines, and outputting a third signal delayed from the first signal; and
   an output circuit including first and second transistors coupled in series between the first and third power supply lines, the first transistor having a control electrode supplied with the second signal, and the second transistor having a control electrode supplied with the third signal.

2. The semiconductor device as claimed in claim 1, wherein the delay circuit includes a first inverter circuit that receives the first signal to generate the inverted signal, and a second inverter circuit that receives the inverted signal to generate the third signal.

3. The semiconductor device as claimed in claim 1, wherein
   the level conversion circuit includes third and fourth transistors that are cross-coupled and fifth and sixth transistors that are coupled in series to the third and fourth transistors, respectively,
   the first signal is supplied to a control electrode of the fifth transistor,
   the inverted signal is supplied to a control electrode of the sixth transistor, and
   the second signal is output from a connection point between the fourth transistor and the sixth transistor.

4. The semiconductor device as claimed in claim 3, wherein the first, third, and fourth transistors are of a first conductivity type, and the second, fifth, and sixth transistors are of a second conductivity type that is opposite to the first conductivity type.

5. The semiconductor device as claimed in claim 4, wherein the first, third, and fourth transistors are P-channel MOS transistors, and the second, fifth, and sixth transistors are N-channel MOS transistors.

6. The semiconductor device as claimed in claim 1, wherein the second transistor has a current supply capability greater than a current supply capability of the first transistor.

7. The semiconductor device as claimed in claim 1, further comprising:
   a first power-supply terminal supplied with the first potential from outside;

a second power-supply terminal supplied with the third potential from outside; and an internal voltage generating circuit generating the second potential.

8. A semiconductor device comprising:

first, second, and third power supply lines;

first, second, third, fourth, fifth, and sixth nodes;

a first transistor having a gate node coupled to the third node, one of source and drain nodes coupled to the third power supply line, and the other of source and drain nodes coupled to the second node;

a second transistor having a gate node coupled to the second node, one of source and drain nodes coupled to the third power supply line, and the other of source and drain nodes coupled to the third node;

a third transistor having a gate node coupled to the first node, one of source and drain nodes coupled to the first power supply line, and the other of source and drain nodes coupled to the second node;

a fourth transistor having a gate node coupled to the fifth node, one of source and drain nodes coupled to the first power supply line, and the other of source and drain nodes coupled to the third node;

a first inverter circuit having an input node coupled to the first node and an output node coupled to the fifth node, and coupled to the first and second power supply lines;

a second inverter circuit having an input node coupled to the fifth node and an output node coupled to the sixth node, and coupled to the first and second power supply lines;

a third inverter circuit having an input node coupled to the third node and an output node coupled to the fourth node, and coupled to the first and third power supply lines; and a fifth transistor having a gate node coupled to the sixth node, one of source and drain nodes coupled to the first power supply line, and the other of source and drain nodes coupled to the fourth node.

9. The semiconductor device as claimed in claim 8, further comprising a sixth transistor, the other of source and drain nodes of the fifth transistor being coupled to the fourth node through the sixth transistor.

10. The semiconductor device as claimed in claim 9, wherein the sixth transistor has a gate node coupled to the third power supply line.

11. A semiconductor device comprising:

a first power supply line supplied with a first potential;

a second power supply line supplied with a second potential higher than the first potential;

a third power supply line supplied with a third potential higher than the second potential;

a level conversion circuit coupled to the first and third power supply lines, receiving a first signal and an inverted signal of the first signal each having an amplitude between the first and second potentials, and outputting a second signal having an amplitude between the first and third potentials;

a delay circuit coupled to the first and second power supply lines, and outputting a third signal delayed from the first signal;

an output including first and second transistors coupled in series between the first and third power supply lines, the first transistor having a control electrode supplied with the second signal, and the second transistor having a control electrode supplied with the third signal; and a seventh transistor coupled in parallel to the second transistor, the seventh transistor having a control electrode supplied with the second signal.

12. A new semiconductor device comprising:

a clock generation circuit configured to generate an internal clock signal phase-controlled based on an external clock signal, a first power supply line supplied with a first potential;

a second power supply line supplied with a second potential higher than the first potential;

a third power supply line supplied with a third potential higher than the second potential;

a level conversion circuit coupled to the first and third power supply lines, receiving a first signal and an inverted signal of the first signal each having an amplitude between the first and second potentials, and outputting a second signal having an amplitude between the first and third potentials, wherein the first signal is the internal clock signal;

a delay circuit coupled to the first and second power supply lines, and outputting a third signal delayed from the first signal; and an output circuit including the first and second transistors coupled in series between the first and third power supply lines, the first transistor having a control electrode supplied with the second signal, and the second transistor having a control electrode supplied with the third signal.

13. The semiconductor device is claimed in 11, wherein the seventh transistor has a current supply capability greater then a current supply capability of the first transistor.

14. The semiconductor device as claimed in claim 11, further comprising an eighth transistor coupled in series to the second transistor, the eighth transistor having a control electrode supplied with the third potential.

* * * * *